(12) United States Patent
Kishimoto et al.

(10) Patent No.: US 8,020,570 B2
(45) Date of Patent: Sep. 20, 2011

(54) SUBSTRATE PROCESSING APPARATUS AND SUBSTRATE PROCESSING METHOD

(75) Inventors: Takuya Kishimoto, Kyoto (JP); Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 929 days.

(21) Appl. No.: 11/964,421

(22) Filed: Dec. 26, 2007

(65) Prior Publication Data

US 2008/0254224 A1 Oct. 16, 2008

(30) Foreign Application Priority Data

Jan. 31, 2007 (JP) ................. 2007-020743

(51) Int. Cl.
*B08B 3/02* (2006.01)
(52) U.S. Cl. ........ 134/148; 134/149; 134/153; 134/902; 156/345.17; 156/345.55
(58) Field of Classification Search .......... 134/32, 134/33, 34, 37, 119, 148, 149, 153, 902; 156/345.17, 345.55
See application file for complete search history.

(56) References Cited

U.S. PATENT DOCUMENTS

| 5,209,180 | A | 5/1993 | Shoda et al. | |
| 5,927,303 | A | 7/1999 | Miya et al. | |
| 6,162,956 | A | 12/2000 | Berlowitz et al. | |
| 2003/0172955 | A1* | 9/2003 | Kuroda et al. | 134/2 |
| 2004/0084144 | A1 | 5/2004 | Yokouchi et al. | |
| 2005/0276921 | A1 | 12/2005 | Miya et al. | |
| 2006/0021636 | A1 | 2/2006 | Miya | |

FOREIGN PATENT DOCUMENTS

| JP | 2002-361155 | 12/2002 |
| JP | 2004-79909 | 3/2004 |
| JP | 2004-119829 | 4/2004 |
| JP | 2004-179535 | 6/2004 |
| JP | 2004-281641 | 10/2004 |
| JP | 2006-32891 | 2/2006 |
| JP | 2006-041444 | 2/2006 |
| JP | 2006-41444 | 2/2006 |
| JP | 2007-142076 | 6/2007 |
| JP | 2007-142077 | 6/2007 |
| KR | 1998-070063 | 10/1998 |
| TW | 533228 | 5/2003 |
| WO | 00/06794 | 2/2000 |

OTHER PUBLICATIONS

Notice of Allowance issued Apr. 29, 2010 in corresponding Taiwanese Patent Application No. 096142589 (JP2006-041444 and its English language translation U.S. 2006/0021636 were previously submitted in an IDS filed on Feb. 7, 2008 and are therefore not enclosed.)

* cited by examiner

*Primary Examiner* — Michael Barr
*Assistant Examiner* — Saeed T Chaudhry
(74) *Attorney, Agent, or Firm* — Ostrolenk Faber LLP

(57) ABSTRACT

A part of the opening of the nozzle insertion hole located in the liquid discharging direction relative to the nozzle inserted in the nozzle insertion hole is enlarged in the liquid discharging direction. Therefore, the droplets which have migrated to the nozzle insertion hole adheres to the internal surface in the liquid discharging direction relative to the nozzle, that is, to the slanted part via the enlarged part. Moreover, the slanted part is provided slanted from the central portion of the nozzle insertion hole toward the enlarged part and separated away from the central portion of the substrate top surface. Hence, the adhering droplets flow in the liquid discharging direction along the slanted part to be discharged from the opening of the nozzle insertion hole.

6 Claims, 12 Drawing Sheets

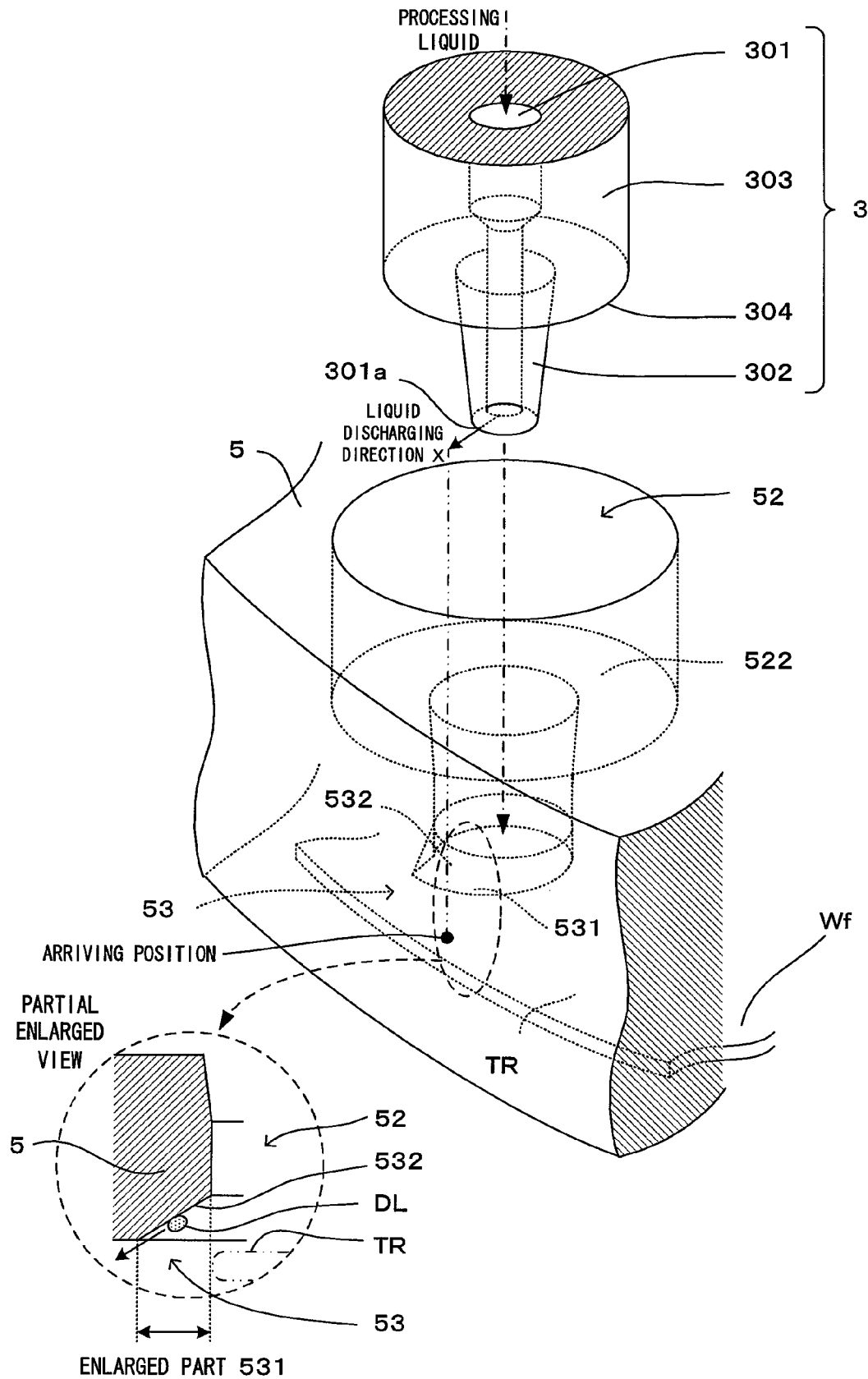
F I G. 13

SUBSTRATE PROCESSING APPARATUS AND SUBSTRATE PROCESSING METHOD

CROSS REFERENCE TO RELATED APPLICATION

The disclosure of Japanese Patent Application No. 2007-020743 filed Jan. 31, 2007 including specification, drawings and claims is incorporated herein by reference in its entirety.

BACKGROUND OF THE INVENTION

1. Field of the Invention

The present invention relates to a substrate processing apparatus and a substrate processing method which supplies a processing liquid to a top rim portion of a substrate to thereby perform a predetermined surface processing to the top rim portion, the substrate including semiconductor wafers, glass substrates for photomask, glass substrates for liquid crystal display, glass substrates for plasma display, substrates for FED (field emission display), substrates for optical disks, substrates for magnetic disks, substrates for magnet-optical disks, etc.

2. Description of the Related Art

In a production process in which a series of processing is performed to the substrates such as semiconductor wafers, a film forming processing is performed for the purpose of forming a various kinds of thin films on the substrate surface. In this film forming processing, the film is sometimes formed on a rear surface of the substrate or a rim portion of the substrate top surface. However, it is only a circuit-forming region at the central portion of the substrate top surface that requires the film to be formed on the substrate in general. And when the films are formed either on the rear surface of the substrate or on the rim portion of the substrate top surface, the following problems may occur. To be more specific, the thin film formed on a rim portion of the substrate top surface may peel off due to a contact with other apparatus during post-processing of the film forming processing. And, the peeled-off thin film may adhere to the circuit-forming region at the central portion of the substrate top surface and to the substrate processing apparatus, which may cause reduced yield of the fabricated products and a trouble of the substrate processing apparatus itself.

Consequently, for the purpose of removing the thin films formed on the rear surface of the substrate and the top rim portion of the substrate, an apparatus described in JP-A-2006-41444, for example, is proposed. In this apparatus, a supporting section is provided projecting upward from a spin base and supports the substrate while abutting on a rim portion of the rear surface of the substrate. The substrate with the thin film formed on the top surface thereof is held horizontally with its top surface facing up. Then, inert gas is supplied from an atmosphere blocking plate (equivalent to an "opposed member" of this invention) disposed above the substrate toward the top surface of the substrate to a space formed between the atmosphere blocking plate and the substrate to press the substrate to the supporting section, whereby the substrate is held by the spin base. And then, the substrate is rotated in a condition that the substrate is held by the spin base. Further, chemical solution, as a processing liquid, is supplied toward the top rim portion of the rotating substrate from a nozzle inserted into a nozzle insertion hole disposed on a rim portion of the atmosphere blocking plate. Consequently, the undesired substance adhering to the top rim portion of the substrate is removed by etching. Furthermore, the chemical solution, as the processing liquid, is supplied to the rear surface of the rotating substrate. Consequently, the chemical solution spreads all over the rear surface of the substrate, thereby removing by etching the undesired substance on the rear surface of the substrate. In this way, the thin films are removed by etching on the substrate rear surface and only on the rim portion of the substrate top surface.

SUMMARY OF THE INVENTION

In the apparatus structured like this, although the processing liquid such as chemical solution is supplied to the top rim portion of the substrate, a part of the processing liquid may sometimes migrate in a form of droplets from the top rim portion of the substrate toward the nozzle insertion hole and adhere to the nozzle insertion hole. If droplets of the processing liquid remain in the nozzle insertion hole, the droplets may sometimes disperse and adhere to the central portion of the top surface during the processing described above. Furthermore, depending on the type of processing liquid, some droplets may turn into solid, which become a cause of particle contamination.

The invention has been made in light of the problem described above and accordingly an object of the invention is to provide a substrate processing apparatus and a substrate processing method, capable of processing the top rim portion of the substrate excellently without receiving negative impact of droplets of the processing liquid by discharging the droplets which have adhered from the top rim portion of the substrate to the nozzle insertion hole from the nozzle insertion hole.

According to a first aspect of the present invention, there is provided a substrate processing apparatus, comprising: a substrate holder which holds a substrate in a condition that a top surface of the substrate is directed toward above; an opposed member which is disposed opposed against and separated away from the top surface of the substrate held by the substrate holder, and is provided with a nozzle insertion hole which has an opening on a substrate opposing surface facing the substrate top surface; a nozzle which discharges, being inserted in the nozzle insertion hole, a processing liquid in a liquid discharging direction from the nozzle insertion hole toward a top rim portion of the substrate, supplies the processing liquid to the top rim portion, and accordingly performs a predetermined surface processing to the top rim portion; and a guide portion which is provided in the nozzle insertion hole and guides droplets of the processing liquid adhering to the nozzle insertion hole in the vicinity of the opening in the liquid discharging direction.

According to a second aspect of the present invention, there is provided a substrate processing method, comprising the steps of: holding a substrate in a condition that a substrate top surface is directed toward above; disposing an opposed member opposed against and separated away from the substrate top surface; inserting a nozzle in a nozzle insertion hole which is provided in the opposed member; performing a predetermined surface processing to a top rim portion of the substrate by discharging a processing liquid in a liquid discharging direction from the nozzle insertion hole toward the top rim portion of the substrate to supply the processing liquid to the top rim portion; and guiding, executed in parallel with the surface processing, droplets of the processing liquid which has migrated from the top rim portion of the substrate to the nozzle insertion hole in the liquid discharging direction.

The above and further objects and novel features of the invention will more fully appear from the following detailed description when the same is read in connection with the accompanying drawing. It is to be expressly understood,

BRIEF DESCRIPTION OF THE DRAWINGS

FIG. 13 is a diagram showing other embodiment of a substrate processing apparatus according to this invention.

DETAILED DESCRIPTION OF THE PREFERRED EMBODIMENTS

First Embodiment

Figure 1:
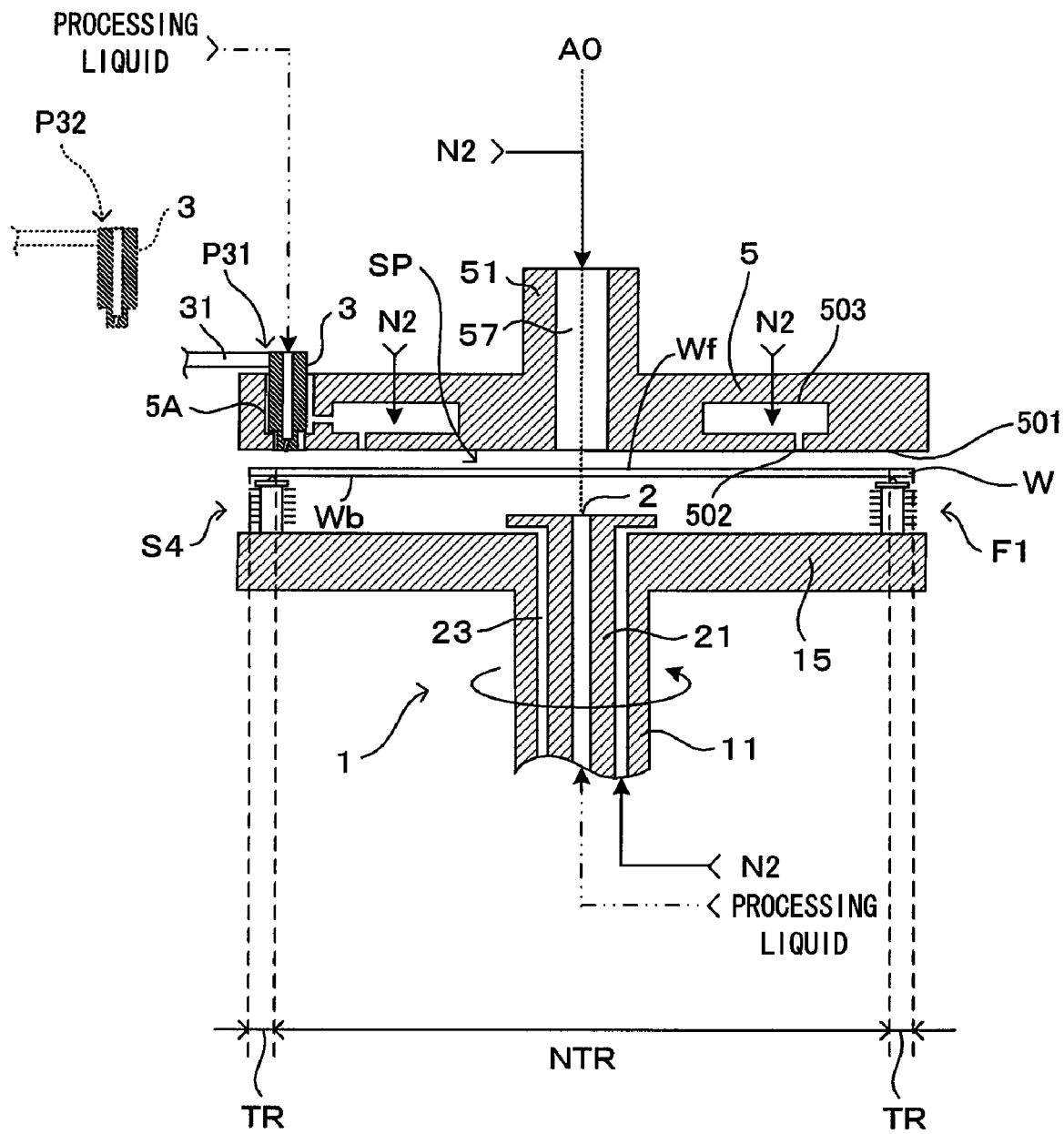
FIG. 1 is a diagram showing a first embodiment of a substrate processing apparatus according to the invention.
Figure 2:
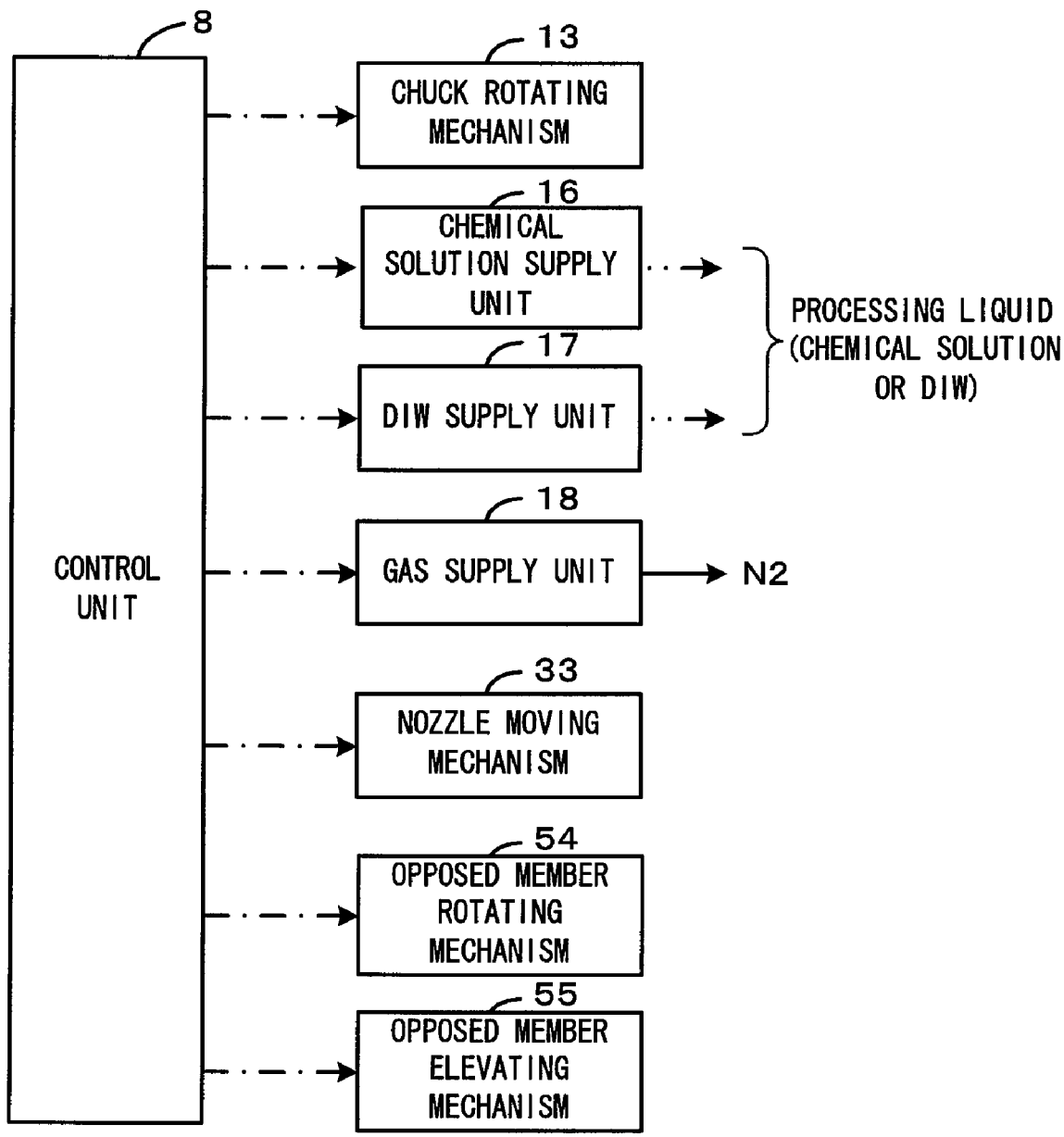
FIG. 2 is a block diagram showing a main control configuration of the substrate processing apparatus which is shown in FIG. 1.

FIG. 1 is a diagram showing a first embodiment of a substrate processing apparatus according to the invention. FIG. 2 is a block diagram showing a main control configuration of the substrate processing apparatus which is shown in FIG. 1. This substrate processing apparatus is an apparatus which cleans a rim portion of a top surface Wf of an approximately circular substrate W such as a semiconductor wafer, specifically an apparatus which removes by etching a thin film (undesired substance) which is present on the rim portion of the top surface Wf of the substrate W or is present both on the rim portion and on a substrate rear surface Wb. The substrates W to be processed include a substrate on the substrate surface Wf of which a this film which is hardly soluble in the chemical solution such as a SiN film or high-k film is formed, and a substrate W on the top surface Wf and the rear surface Wb of which the above thin film is formed. Consequently, in the case where the thin film is formed only on the substrate top surface Wf, a chemical solution and a rinsing liquid such as DIW (deionized water) are supplied to a rim portion (corresponding to a "top rim portion" of the invention) TR of the substrate top surface Wf to thereby remove the thin film from the rim portion TR by etching (the chemical solution and the rinsing liquid are hereinafter collectively called the "processing liquid"), and the processing liquid is supplied to the substrate rear surface Wb to thereby clean the rear surface Wb. On the other hand, in the case where the thin film is formed on the both surfaces Wf and Wb of the substrate W, the processing liquid is supplied to the rim portion TR of the top surface and to the rear surface Wb to thereby remove the thin film by etching from the rim portion TR of the top surface and to the rear surface Wb. Meanwhile, the substrate top surface Wf means a device-formed surface on which a device pattern is formed in this embodiment.

This substrate processing apparatus comprises a spin chuck 1, an under surface processing nozzle 2, a nozzle 3, and an opposed member 5. The spin chuck 1 holds and rotates the substrate W approximately horizontally in a condition that the substrate top surface Wf is directed toward above. The under surface processing nozzle 2 supplies the processing liquid to a central portion in the under surface (rear surface Wb) of the substrate W which is held by the spin chuck 1. The nozzle 3 supplies the processing liquid from the side of the substrate top surface to the top rim portion TR of the substrate W which is held by the spin chuck 1. The opposed member 5 is disposed opposed against the top surface Wf of the substrate W which is held by the spin chuck 1.

A hollow rotation column 11 of the spin chuck 1 is linked to a rotation shaft of a chuck rotating mechanism 13 which includes a motor. The rotation column 11 is rotatable about a rotation center A0 when the chuck rotating mechanism 13 is driven. A spin base 15 is connected by a fastening component such as a screw to a top end portion of the rotation column 11 as one integrated unit. The spin base 15 therefore rotates about the rotation center A0 by driving the chuck rotating mechanism 13 in response to an operation command received from a control unit 8 which controls the entire apparatus.

Further, a processing liquid supply pipe 21 is inserted in the hollow rotation column 11, and the under surface processing nozzle 2 is coupled with the top end of the processing liquid supply pipe 21. The processing liquid supply pipe 21 is connected with a chemical solution supply unit 16 and a DIW supply unit 17, and the chemical solution and DIW which serves as the rinsing liquid are selectively supplied. Further, a gap between an inner wall surface of the rotation column 11 and an outer wall surface of the processing liquid supply pipe 21 forms a ring-like gas supply path 23. The gas supply path 23 is connected with a gas supply unit 18. Hence, it is possible to supply nitrogen gas to a space between the substrate rear surface Wb and a top surface of the spin base 15 which is opposed to the substrate rear surface Wb. Meanwhile, although the gas supply unit 18 supplies nitrogen gas in this embodiment, the gas supply unit 18 may supply air, other inert gas, etc.

Figure 3:
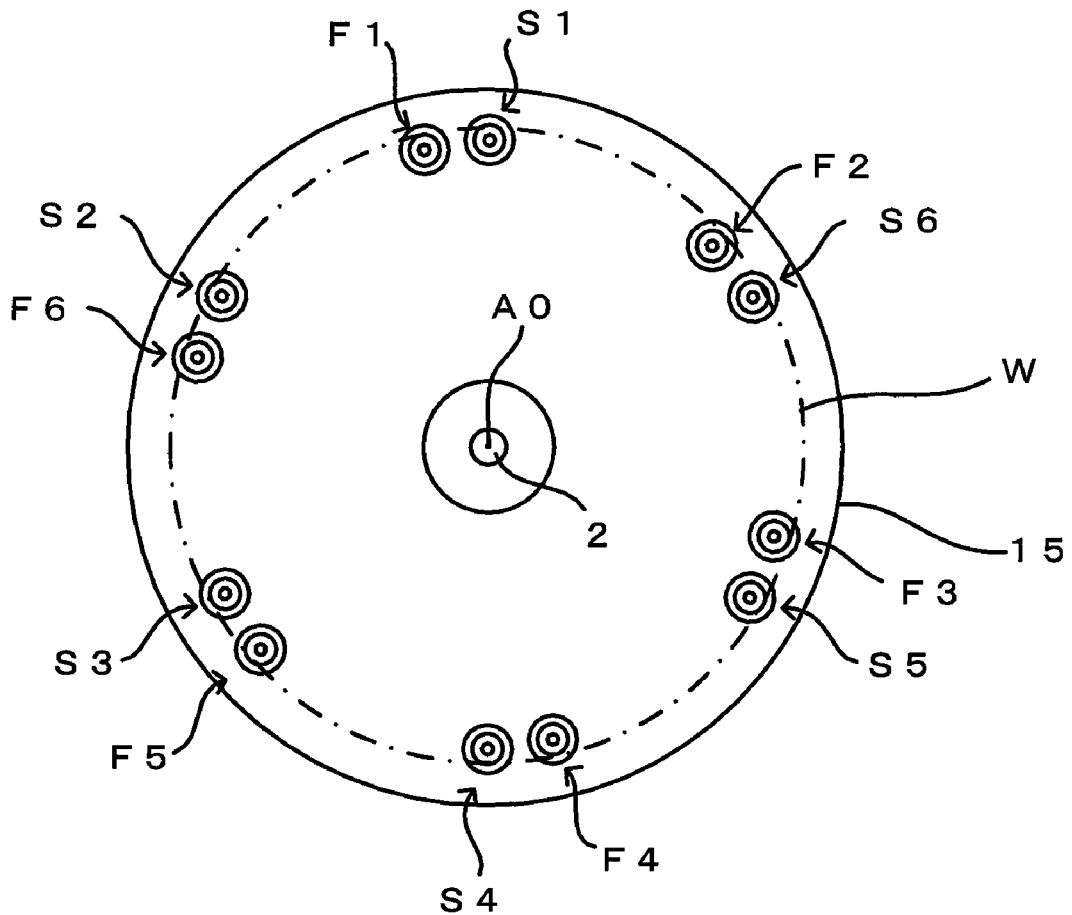
FIG. 3 is a plan view of the spin base as viewed from above.

FIG. 3 is a plan view of the spin base as viewed from above. There is an opening in a central portion of the spin base 15. Further, in the vicinity of a rim portion of the spin base 15, plural (six in this embodiment) first support pins F1 through F6 and plural (six in this embodiment) second support pins S1 through S6 are disposed such that they are capable of freely ascending and descending. The first support pins F1 through F6 are disposed projecting toward above from the spin base 15 in a circle around the rotation center A0 approximately equiangularly. The second support pins S1 through S6 are disposed projecting toward above from the spin base 15 in a circle around the rotation center A0 approximately equiangularly and are located between the first support pins F1 through F6. In short, six pairs of the support pins, each of which is one first support pin and one second support pin which are paired, are disposed in a circle around the rotation center A0 in the rim portion of the spin base 15 such that they project toward above.

Each of the first support pins F1 through F6 and the second support pins S1 through S6 abuts on the substrate rear surface Wb, which makes it possible to support the substrate W approximately horizontally in a condition that the substrate W is spaced apart by a predetermined distance toward above from the spin base 15. Of these pins, the six first support pins F1 through F6 disposed between every other second support pins along the circumference constitute the first support pin group. The first support pins F1 through F6 of the first support pin group operate together in supporting the substrate W or in moving away from the substrate rear surface Wb to release the substrate W from supporting. Meanwhile, the remaining six second support pins S1 through S6 constitute the second support pin group. The second support pins S1 through S6 of the second support pin group operate together in supporting the substrate W or in moving away from the substrate rear surface Wb to release the substrate W from supporting. While there may be at least three support pins in each support pin group in order to support the substrate W horizontally, since the number of the support pins in each support pin group is six, it is possible to support the substrate W stably.

Figure 4:
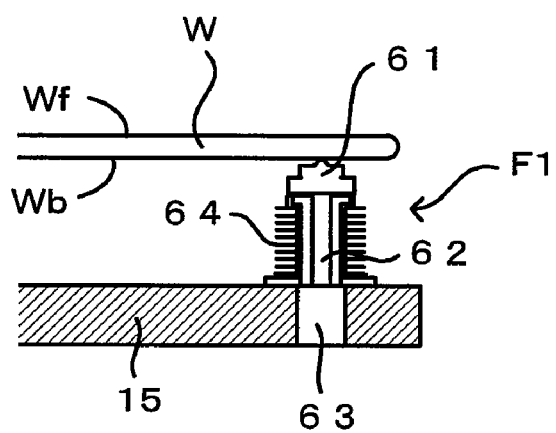
FIG. 4 is a partial enlarged view showing a structure of the support pin.

FIG. 4 is a partial enlarged view showing a structure of the support pin. Since each of the support pins F1 through F6 and S1 through S6 is identically structured, a detailed description of the structure is hereby made on one support pin F1 with reference to the drawing. The support pin F1 includes an abutting portion 61, a movable rod 62, an elevating driver 63, and a bellows 64. The abutting portion 61 is capable of abutting on and separating away from the under surface of the substrate W. The movable rod 62 supports the abutting portion 61 such that the abutting portion 61 is movable up and down. The elevating driver 63 includes a motor which moves the movable rod 62 up and down. The bellows 64 is provided so as to encircle the movable rod 62 to block the movable rod 62 and the elevating driver 63 from the surrounding atmosphere. The bellows 64 is made of PTFE (poly-tetrafluoroethylene) for example, and protects the movable rod 62 which is made of stainless steel (SUS), aluminum, or the like when the substrate W is processed by means of a chemical solution such as hydrofluoric acid. Further, it is desirable that the abutting portion 61 is made of PCTFE (poly-chlorotrifluoroethylene) considering chemical resistance. The top end of the bellows 64 is fixed on the underside of the abutting portion 61, whereas the bottom end of the bellows 64 is fixed on the top surface side of the spin base 15.

The elevating driver 63 drives the movable rod 62 by a stroke of 1 to several mm via a driving link portion (not shown) based on driving signals from the control unit 8, whereby the support pins F1 through F6 and S1 through S6 which are structured in the manner described above support the substrate W in the following manner. To be more specific, in a condition that the elevating driver 63 is not driven, each of the support pins F1 through F6 and S1 through S6 is biased upward with a biasing section (not shown) such as coil springs so as to support the substrate W at a predetermined height (substrate processing position). Hence, the substrate W is supported by both of the support pin groups, namely, the first support pin group consisting of the support pins F1 through F6 and the second support pin group consisting of the support pins S1 through S6. On the other hand, when the support pins S1 through S6 are driven downward against the biasing force, the abutting portions 61 of the support pins S1 through S6 separate away from the substrate rear surface Wb, leaving the substrate W supported only by the first support pin group consisting of the support pins F1 through F6. Further, when the support pins F1 through F6 are driven downward against the biasing force, the abutting portions 61 of the support pins F1 through F6 separate away from the substrate rear surface Wb, leaving the substrate W supported only by the second support pin group consisting of the support pins S1 through S6.

Description is to be continued by referring back to FIG. 1. A disc-shaped opposed member 5 which is opposed against the substrate W which is held by the spin chuck 1 is disposed horizontally above the spin chuck 1. The opposed member 5 is attached to the bottom end of the rotation column 51 which is coaxially arranged with the rotation column 11 of the spin chuck 1 so as to be rotatable integrally. An opposed member rotating mechanism 54 is connected with the rotation column 51. A motor of the opposed member rotating mechanism 54 is driven in response to an operation command from the control unit 8, whereby the opposed member 5 is rotated about the rotation center A0. Further, the control unit 8 controls the opposed member rotating mechanism 54 so as to synchronize with the chuck rotating mechanism 13, whereby the opposed member 5 is driven to rotate in the same rotating direction and at the same rotation speed as the spin chuck 1.

Further, the opposed member 5 is connected with an opposed member elevating mechanism 55. An actuator for elevating drive (such as an air cylinder for instance) is activated, whereby the opposed member 5 is close to and opposed against the spin base 15, and is adversely separated away from the spin base 15. The control unit 8 moves the opposed member 5 upward to a separated position sufficiently away above the spin chuck 1, during loading and unloading of the substrate W into and from the substrate processing apparatus for example. On the other hand, the control unit 8 moves the opposed member 5 down to a predetermined opposed position very close to the top surface Wf of the substrate W which is held by the spin chuck 1 when cleaning processing is performed to the substrate W. This causes the lower surface (corresponding to a "substrate opposing surface" of the invention) 501 of the opposed member 5 and the substrate top surface Wf to be positioned facing closely with each other.

A gas supplying path 57 is formed in an opening in the center of the block member 5 and a hollow portion of the rotation column 51. This gas supplying path 57 is connected with the gas supply unit 18, whereby a nitrogen gas is supplied to a space SP between the substrate top surface Wf and the lower surface 501 of the opposed member 5.

Figure 5A:
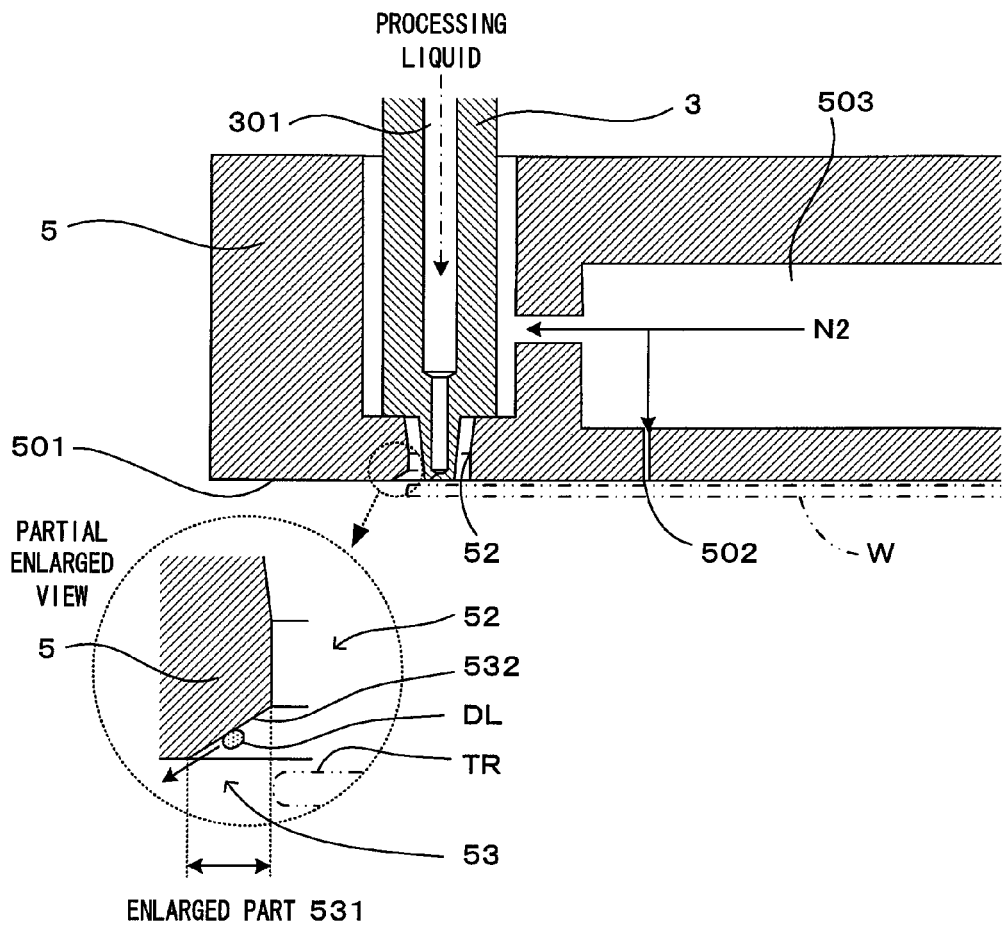
FIGS. 5A and 5B are diagrams showing the opposed member.
Figure 5B:
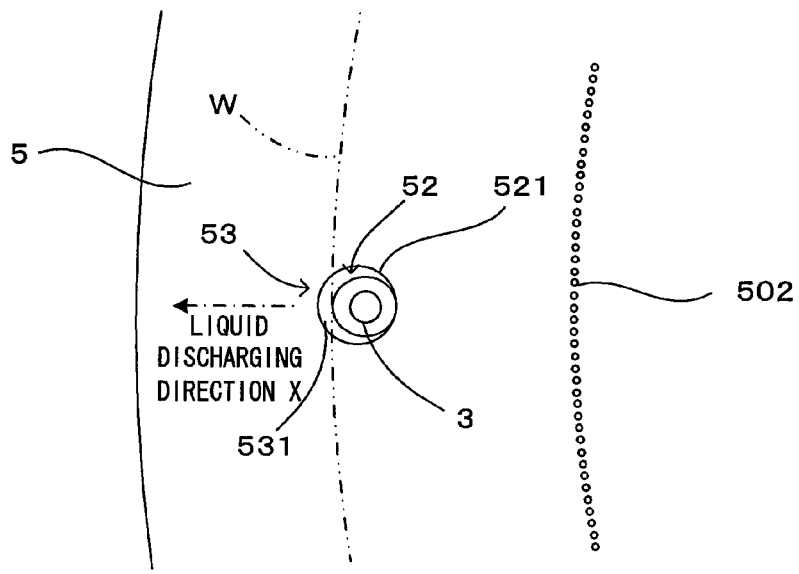
Figure 6:
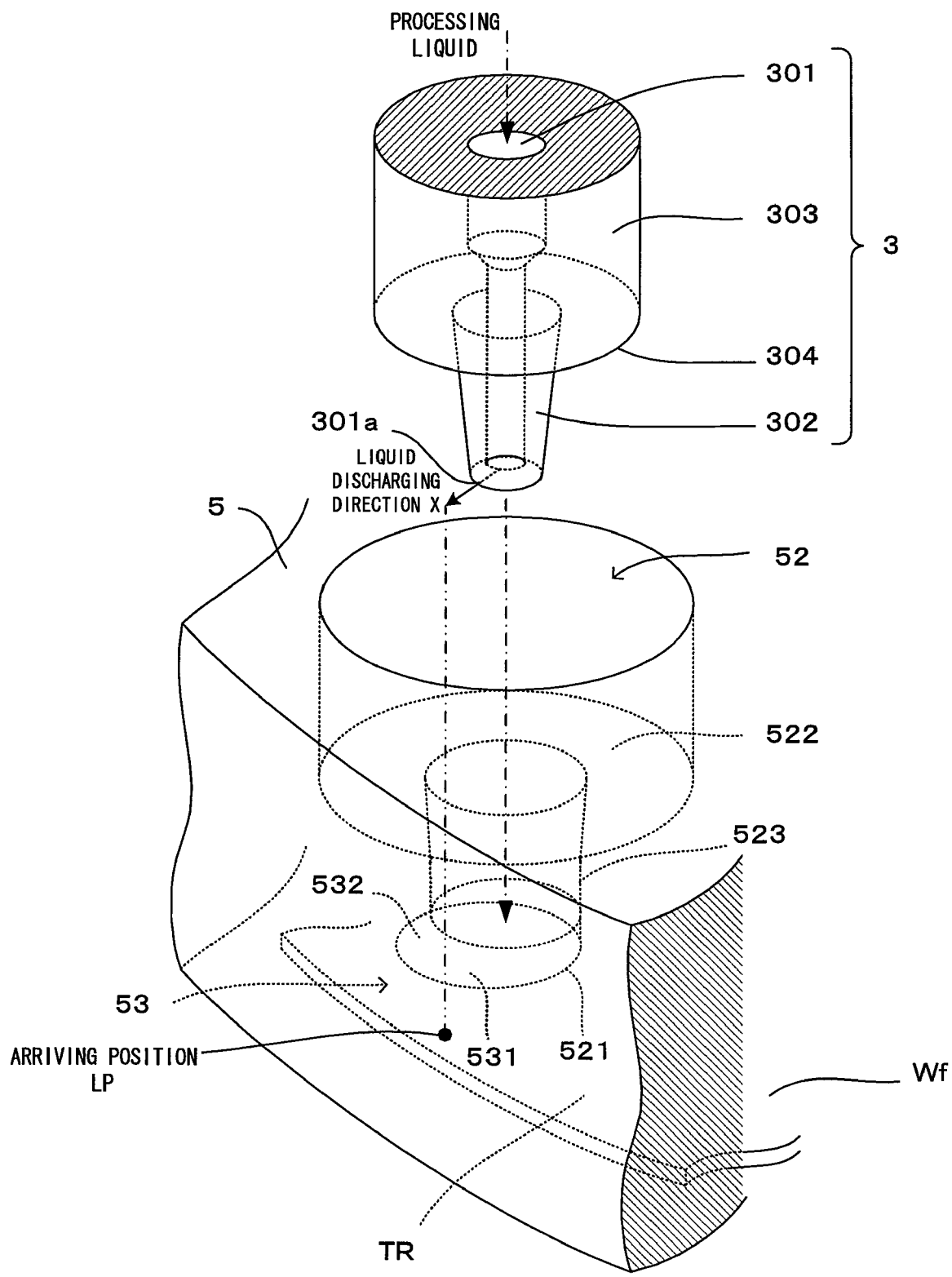
FIG. 6 is a partial perspective view showing a nozzle and a nozzle insertion hole.

FIGS. 5A and 5B are diagrams showing the opposed member. FIG. 5A is a partial sectional view of the opposed member and FIG. 5B is a lower surface view of the opposed member from the substrate. Further, FIG. 6 is a partial perspective view showing a nozzle and a nozzle insertion hole. The lower surface 501 of the opposed member 5 has a plane size equal to or larger than the diameter of the substrate W. Consequently, when the opposed member 5 is positioned at the opposed position, it covers the entire substrate surface, to thereby block the atmosphere above the substrate top surface Wf from the surrounding atmosphere.

A plurality of gas discharging openings 502 are formed on the lower surface 501 of the opposed member 5. These gas discharging openings 502 are formed equiangularly along the circumference whose center is the rotation center A0 at the position opposite to the central portion of the surface of the substrate W which is held by the spin chuck 1, that is, at the position opposite to a non-processing region NTR (FIG. 1) which is radially inside of the top rim portion TR. These gas discharging openings 502 are communicated with a gas distribution space 503 formed inside the opposed member 5. Hence, when a nitrogen gas is supplied to the gas distribution space 503, the nitrogen gas is supplied to the space SP via the plurality of gas discharging openings 502.

When the nitrogen gas is supplied to the space SP from the plurality of gas discharging openings 502 and the gas supplying path 57 in a condition that the opposed member 5 is positioned at the opposed position, the internal pressure of the space SP rises to press the substrate W against the support pins F1 through F6 and S1 through S6 which abut on the rear surface Wb of the substrate W. When the spin base 15 rotates in accordance with the operation command of the control unit 8 with the pressed state, the substrate W rotates together with the spin base 15 while being supported by the support pins F1 through F6 and S1 through S6 due to the frictional force generated between the substrate rear surface Wb and the support pins F1 through F6 and S1 through S6. Meanwhile, the nitrogen gas supplied to the space SP flows radially outside of the substrate W.

A nozzle insertion hole 52 which penetrates the opposed member 5 in the vertical axis direction is formed in the rim portion of the opposed member 5 and an opening 521 is formed in the lower surface 501 of the opposed member 5, as shown in FIG. 5A. The nozzle 3 is inserted into the nozzle insertion hole 52, and the processing liquid is discharged in a liquid discharging direction X from the nozzle insertion hole 52 toward the top rim portion TR of the substrate W, whereby the processing liquid is supplied to the top rim portion TR. At this stage, the structure of the nozzle 3 and the nozzle insertion hole 52 are further described in more detail with reference to FIGS. 1, 2, 5A, 5B and 6.

The nozzle 3 is attached to one end of a nozzle arm 31 which extends horizontally as shown in FIG. 1. The other end of the nozzle arm 31 is connected with a nozzle moving mechanism 33 (FIG. 2). The nozzle moving mechanism 33 makes the nozzle 3 horizontally pivot about the predetermined pivot shaft and move up and down. Therefore, when the nozzle moving mechanism 33 is driven in accordance with an operation command from the control unit 8, the nozzle 3 moves to a supplying position P31 and to a stand-by position P32 which is separated away from the substrate W. The supplying position P31 is a position at which the nozzle 3 is inserted into the nozzle insertion hole 52 of the opposed member 5 and from which the chemical solution or DIW is supplied to the top rim portion TR.

The nozzle 3 is formed to match the shape of the nozzle insertion hole 52 which is provided in the opposed member 5. To be more specific, the outside diameter of the nozzle 3 is formed to be from about 5 mm to about 6 mm for example, so as not to unnecessarily enlarge the hole diameter of the nozzle insertion hole 52. Further, the nozzle 3 is arranged in such a manner that the cross-sectional area of the tip end of a nozzle barrel which is shaped approximately cylindrically is different from that of the rear end of the nozzle barrel. Specifically, the nozzle 3 is arranged in such a manner that the cross-sectional area of a barrel 302 which is in the tip end side of the nozzle is smaller than the cross-sectional area of a barrel 303 which is in the rear end side of the nozzle, and a stepped surface 304 is formed between the barrel 302 which is in the tip end side of the nozzle and the barrel 303 which is in the rear end side of the nozzle. In other words, an outer circumferential surface (side surface) of the barrel 302 which is in the tip end side of the nozzle and an outer circumferential surface (side surface) of the barrel 303 which is in the rear end side of the nozzle are connected via the stepped surface 304. The stepped surface 304 is formed so as to encircle the barrel 302 which is in the tip end side of the nozzle and to be approximately parallel to the top surface Wf of the substrate which is held by the spin chuck 1.

Further, a liquid supplying path 301 is formed inside the nozzle 3. The liquid supplying path 301 is connected with the chemical solution supply unit 16 and the DIW supply unit 17 at the rear end of the nozzle, whereby the chemical solution or DIW is selectively supplied. On the other hand, a discharging opening 301a of the nozzle 3 is formed at the tip end portion (bottom end portion) of the liquid supplying path 301. This discharging opening 301a is open outward in a radial direction of the substrate W. Consequently, when the chemical solution is pumped from the chemical solution supply unit 16 to the liquid supplying path 301, the chemical solution is discharged from the nozzle 3 in the liquid discharging direction X to be supplied to the top rim portion TR. Thus supplied chemical solution flows outward in a radial direction of the substrate W, and outflows to the outside of the substrate. Therefore, the chemical solution is not supplied to the non-processing region NTR which is inside of the supplying position of the chemical solution in a radial direction, and the thin film is removed by etching in a constant width (rim etching width) inward from the edge surface of the substrate W. Further, when the DIW is pumped from the DIW supply unit 17 to the liquid supplying path 301, the DIW is discharged from the nozzle 3 outward in a radial direction of the substrate W. Hence, the chemical solution supplied to the top rim portion TR is washed away with the DIW. Meanwhile, denoted at LP in FIG. 6 is a position of the top rim portion TR at which the processing liquid (chemical solution or DIW) arrives.

On the other hand, the nozzle insertion hole 52 is structured as follows. An abutting surface 522 in a form of a ring which can abut on the stepped surface 304 of the nozzle 3 is formed on the internal wall of the nozzle insertion hole 52 as shown in FIG. 6. And when the nozzle 3 is inserted into the nozzle insertion hole 52, the stepped surface 304 abuts on the abutting surface 522, whereby the nozzle 3 is positioned at the supplying position P31 (FIG. 1). The tip end surface of the nozzle 3 is flush with the lower surface (substrate opposing surface) 501 of the opposed member 5 when the nozzle 3 is positioned at the supplying position P31. Meanwhile, the abutting surface 522 is formed approximately in parallel with the lower surface 501 of the opposed member 5, that is, approximately in parallel with the substrate top surface Wf, and hence, the abutting surface 522 is in contact with the stepped surface 304 of the nozzle 3 in a plane. Consequently, when the nozzle 3 is positioned at the supplying position P31, the nozzle 3 is securely positioned abutting on the opposed member 5, and it is possible to position the nozzle 3 in a stable manner.

In the nozzle insertion hole 52, the respective parts of the opening side are made in the following shape to form a guide portion 53. And droplets DL can be effectively discharged from the nozzle insertion hole 52 by the guide portion 53. To be more specific, in the vicinity of the opening of the nozzle insertion hole 52, a part 531 of the opening 521 located at the side of the liquid discharging direction X with respect to the nozzle 3 inserted into the nozzle insertion hole 52 is provided enlarged. This part 531 corresponds to the "enlarged part" of the invention. Further, a part 532 of the inner wall surface of the nozzle insertion hole 52 located at the side of the liquid discharging direction X with respect to the nozzle 3 is provided such that the part 532 is distanced from the side of the center of the surface of the substrate W while slanting from the central portion of the nozzle insertion hole 52 toward the enlarged part 531. This part 532 corresponds to the "slanted part" of the invention.

Figure 7:
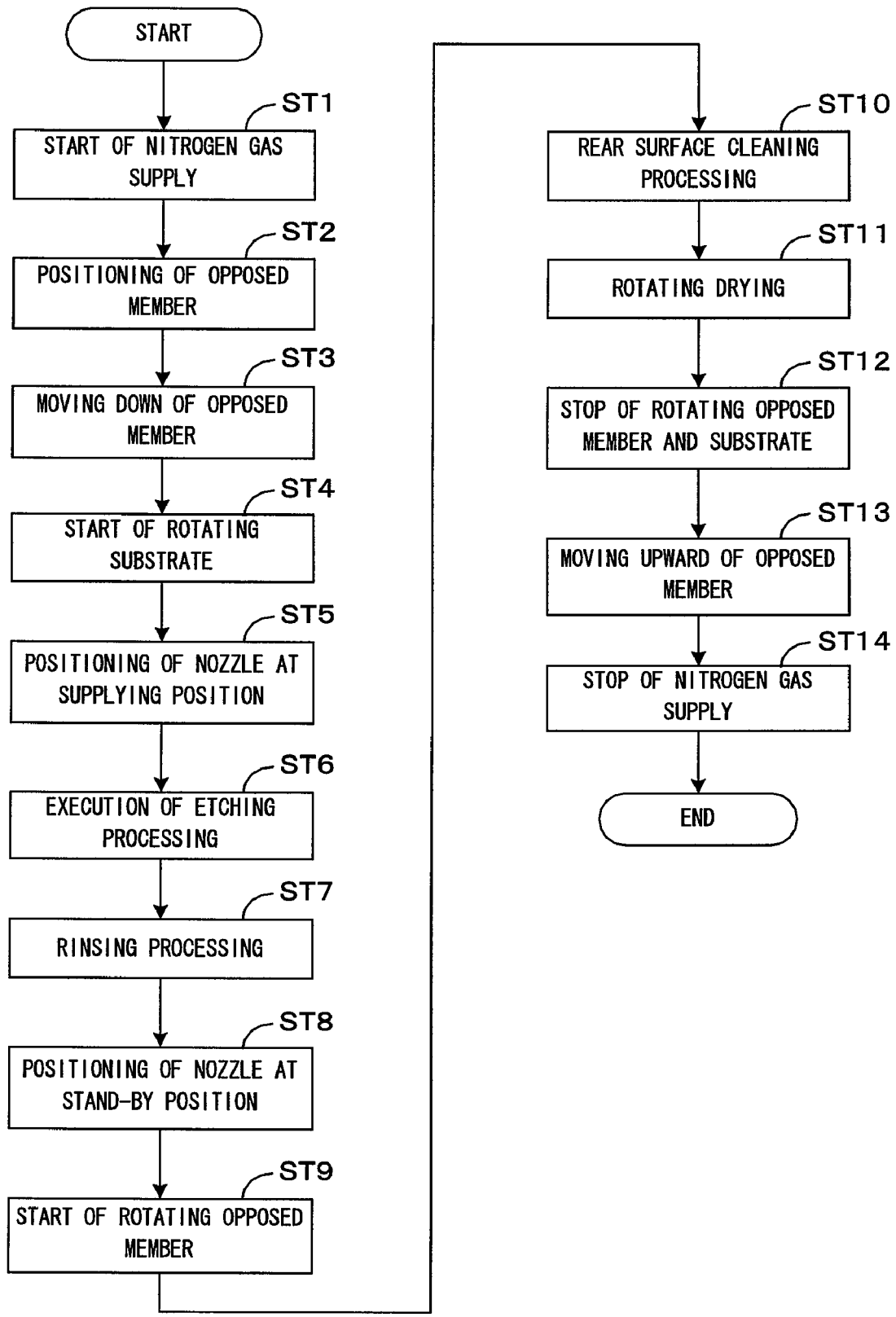
FIG. 7 is a flow chart showing an operation of the substrate processing apparatus shown in FIG. 1.
Figure 8:
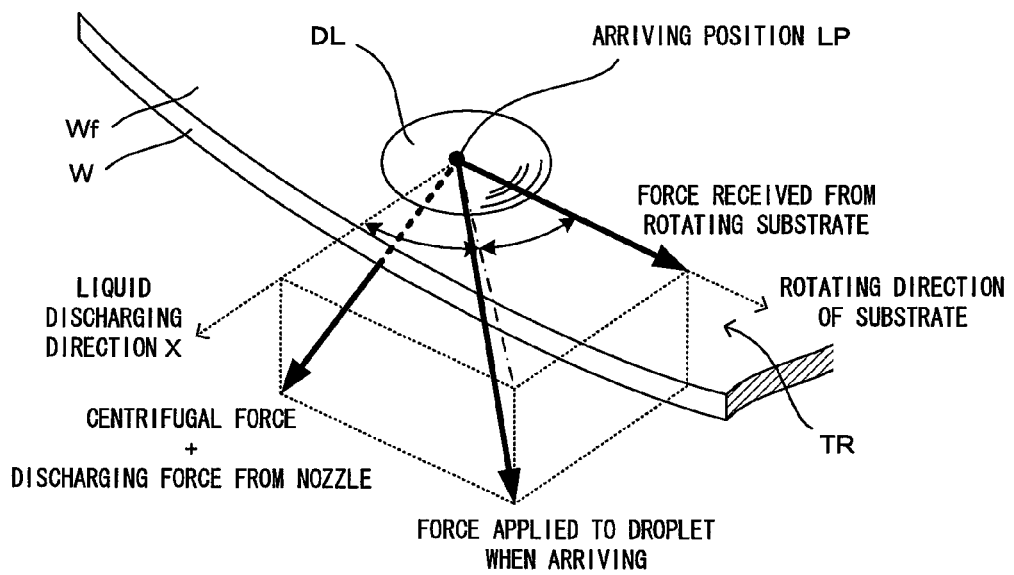
FIG. 8 is a perspective view showing a frame format of forces applied to a droplet which arrives at the top rim portion.

Next, an operation of the substrate processing apparatus structured as described above is described by referring to FIGS. 7 and 8. FIG. 7 is a flow chart showing an operation of the substrate processing apparatus shown in FIG. 1. FIG. 8 is a perspective view showing a frame format of forces applied to a droplet which arrives at the top rim portion.

In this apparatus, when the substrate W yet to be processed is loaded into inside the apparatus, the control unit 8 controls respective portions of the apparatus, whereby a sequence of film removing processing (chemical solution processing step+rinsing step+drying step) is performed to the substrate W. Here, a description is made on an operation which performs a predetermined processing to a substrate on the substrate top surface Wf of which a thin film is formed. That is, the substrate top surface Wf is the surface on which the thin film is formed. Consequently, in this embodiment, the substrate W is loaded into the apparatus with the substrate top surface Wf facing upward. Meanwhile, the opposed member 5 is positioned at the separated position to prevent the interference with the substrate W upon loading the substrate.

When the unprocessed substrate W is placed on the support pins F1 through F6 and S1 through S6, the nitrogen gas is discharged from the gas discharging openings 502 of the opposed member 5 located at the separated position, and the nitrogen gas is discharged from the gas supplying path 57 (Step ST1: substrate holding step). Then, the opposed member 5 is rotated to position the opposed member 5 with respect to the rotating direction so that the nozzle insertion hole 52 is at a predetermined position (Step ST2). The opposed member 5 is moved down to the opposed position and is positioned close to the substrate top surface Wf, thereafter (Step ST3: arranging step). This increases an internal pressure in the space SP between the lower surface (substrate opposing surface) 501 of the opposed member 5 and the substrate top surface Wf, whereby the substrate W is pressed against the support pins F1 through F6 and S1 through S6 which abut on its under surface (rear surface Wb) to be held by the spin base 15. Further, the substrate top surface Wf is covered with the lower surface 501 of the opposed member 5, whereby the substrate top surface Wf is securely blocked from the outside atmosphere surrounding the substrate. Meanwhile, the substrate W may be supported by all of the support pins F1 through F6 and S1 through S6 as described above, or may be supported only by the first support pin group consisting of the support pins F1 through F6, or may be supported only by the second support pin group consisting of the support pins S1 through S6.

Next, the substrate W is rotated in a condition that the opposed member 5 is stopped (Step ST4). At this stage, the substrate W pressed against the support pins F1 through F6 and S1 through S6 rotates together with the spin base 15 while held by the spin base 15 due to a friction force generated between the support pins F1 through F6 and S1 through S6 and the substrate rear surface Wb. Subsequently, the nozzle 3 is moved from the stand-by position P32 and is positioned at the supplying position P31 (Step ST5). Specifically, the nozzle 3 is moved horizontally to the position above the nozzle insertion hole 52 of the opposed member 5. Then, the nozzle 3 is moved down to be inserted into the nozzle insertion hole 52 (inserting step).

When the rotation speed of the substrate W reaches a predetermined speed (600 rpm for instance), the chemical solution is supplied continuously from the nozzle 3 to the top rim portion TR of the rotating substrate W (supplying step). Hence, the thin film is removed by etching from the whole circumference of the top rim portion TR and the portion of the substrate edge surface extending from the top rim portion TR (Step ST6). When the chemical solution processing is completed, the supply of the chemical solution is stopped and DIW is supplied from the nozzle 3. Hence, rinsing processing is performed to the top rim portion TR and to the edge surface of the substrate W (Step ST7). When the rinsing processing is completed after DIW is supplied for a predetermined time period, the supply of DIW is stopped.

After the rinsing processing is completed, the nozzle 3 is moved from the supplying position P31 and is positioned at the stand-by position P32 (Step ST8). Subsequently, the opposed member 5 is rotated at approximately the same rotation speed and in the same direction as that of the spin base 15 (Step ST9). Then, the processing liquid is supplied from the under surface processing nozzle 2 to the rear surface Wb of the rotating substrate W, and a rear surface cleaning processing is executed to the substrate rear surface Wb (Step ST10). Specifically, the chemical solution and the rinsing liquid are supplied sequentially as the processing liquid from the under surface processing nozzle 2 toward the central portion of the substrate rear surface Wb, whereby the entire rear surface and the substrate edge surface portion extending from the rear surface Wb are cleaned. Thus, rotating the opposed member 5 together with the substrate W prevents the processing liquid adhering to the opposed member 5 from causing negative impact on the process. This also suppresses development of excessive airflow associated with the rotation between the substrate W and the opposed member 5, to thereby prevent mist-like processing liquid from getting into the substrate top surface Wf.

At this stage, the support pins F1 through F6 and S1 through S6 are moved away from the substrate rear surface Wb at least once during the cleaning processing, whereby the processing liquid is flowed over to the abutting portions of the substrate rear surface Wb where the support pins F1 through F6 and S1 through S6 abut to the substrate rear surface Wb to clean the portions. For example, a condition that the substrate W is supported by both of the support pin groups, namely, the first support pin group consisting of the support pins F1 through F6 and the second support pin group consisting of the support pins S1 through S6, is switched during the cleaning processing to a condition that the substrate W is supported only by the first support pin group, whereby the processing liquid is flowed over to the abutting portions where the support pins of the second support pin group abut to the substrate W. Subsequently, after the condition is shifted to the condition that the substrate W is supported by both of the support pin groups, the condition is switched to a condition that the substrate W is supported only by the second support pin group, whereby the processing liquid is flowed over to the abutting portions where the support pins of the first support pin group abut to the substrate W. Hence, the processing liquid is flowed over to all of the abutting portions where the support pins F1 through F6 and S1 through S6 abut to the substrate W, whereby the cleaning processing is performed to the entire rear surface.

When the rear surface cleaning processing is thus completed, the substrate W and the opposed member 5 are rotated at high speed (1500 rpm for example). Consequently, the drying of the substrate W is executed (Step ST11). At this time, nitrogen gas is supplied also from the gas supplying path 23 together with the supply to the substrate top surface Wf, whereby the nitrogen gas is supplied to both of the surfaces of the substrate W and the drying processing of the substrate W is accelerated.

When the drying processing of the substrate W is completed, the rotation of the substrate W is stopped at the same time as the rotation of the opposed member 5 is stopped (Step ST12). Then, after the opposed member 5 is moved upward (Step ST13), the supply of nitrogen gas from the gas supplying path 57 and the gas discharging openings 502 is stopped (Step ST14). Hence, the substrate W is released from being pressed and held against the support pins F1 through F6 and S1 through S6, and the processed substrate W is unloaded from the apparatus.

Incidentally, when the processing liquid is supplied from the nozzle 3 as described above, a portion of the processing liquid may sometimes migrate in the form of droplets from the top rim portion TR toward the nozzle insertion hole 52 and adhere to the nozzle insertion hole 52. The analysis of a force applied to the droplets DL, which have arrived at the top rim portion TR of the substrate W, reveals the following. That is, while a portion of the processing liquid in the form of droplets migrates from the substrate W toward the nozzle insertion hole 52, mainly two types of forces are applied to the droplets DL as shown in FIG. 8. One is a component in the liquid discharging direction X (centrifugal force created by rotating substrate+discharging force from the nozzle 3) and the other is a component in the rotating direction of the substrate W (force received from the rotating substrate W). Therefore, most of the droplets DL migrate from the arriving positions in the liquid discharging direction X, and consequently, a portion of the droplets adhere to the nozzle insertion hole 52.

Thus, in this embodiment, a guide portion 53 is provided in the nozzle insertion hole 52 so that the droplets of the processing liquid which have migrated from the top rim portion TR of the substrate W to the nozzle insertion hole 52 are guided in the liquid discharging direction X and are discharged from the nozzle insertion hole 52 effectively. Specifically, a part of the opening 521 located in the liquid discharging direction X relative to the nozzle 3 inserted in the nozzle insertion hole 52 is extended in the liquid discharging direction X to be provided as an enlarged part (a part of the opening in the liquid discharging direction) 531. Hence, the droplets DL which have migrated to the nozzle insertion hole 52 adhere to the internal surface in the liquid discharging direction X relative to the nozzle 3, that is, a slanted part 532 via the enlarged part 531 (see the partial enlarged view in FIG. 5A). Moreover, this slanted part 532 is formed slanting from a center of the nozzle insertion hole 52 toward the enlarged part 531 and separating away from the central portion of the top surface of the substrate W. Hence, the adhering droplets DL flow along the slanted part 532 in the liquid discharging direction X, and are discharged from the opening 521 of the nozzle insertion hole 52. As a result, the top rim portion TR of the substrate W can be processed in an excellent condition, without being negatively affected by the droplets DL.

Further, according to this embodiment, the substrate opposing surface (lower surface) 501 has a plan size larger than that of the substrate top surface Wf, covers the entire substrate top surface Wf, and the enlarged part 531 extends in a radial direction of the substrate W beyond the top rim portion TR of the substrate W (see FIGS. 5A and 5B). Hence, in a manner described above, the droplets DL are guided by the guide portion 53 to a position away from the substrate W. As a result, the droplets DL can be moved away from the substrate top surface Wf, and it is possible to perform the substrate processing more favorably.

In other words, this embodiment comprises: a substrate holder which holds a substrate in a condition that a top surface of the substrate is directed toward above; an opposed member which is disposed opposed against and separated away from the top surface of the substrate held by the substrate holder, and is provided with a nozzle insertion hole which has an opening on a substrate opposing surface facing the substrate top surface; a nozzle which discharges, being inserted in the nozzle insertion hole, a processing liquid in a liquid discharging direction from the nozzle insertion hole toward a top rim portion of the substrate, supplies the processing liquid to the top rim portion, and accordingly performs a predetermined surface processing to the top rim portion; and a guide portion which is provided in the nozzle insertion hole and guides droplets of the processing liquid adhering to the nozzle insertion hole in the vicinity of the opening in the liquid discharging direction.

Further this embodiment comprises the steps of: holding a substrate in a condition that a substrate top surface is directed toward above; disposing an opposed member opposed against and separated away from the substrate top surface; inserting a nozzle in a nozzle insertion hole which is provided in the opposed member; performing a predetermined surface processing to a top rim portion of the substrate by discharging a processing liquid in a liquid discharging direction from the nozzle insertion hole toward the top rim portion of the substrate to supply the processing liquid to the top rim portion; and guiding, executed in parallel with the surface processing, droplets of the processing liquid which have migrated from the top rim portion of the substrate to the nozzle insertion hole in the liquid discharging direction.

In the arrangement described above, the opposed member is disposed opposed against and separated away from the substrate top surface. Then, the nozzle is inserted into the nozzle insertion hole formed in the opposed member, and the processing liquid is discharged from the nozzle to the top rim portion of the substrate to be supplied to the top rim portion. When the processing liquid is supplied in this manner, a part of the processing liquid sometimes migrates to the nozzle insertion hole in a form of droplets. Particularly in the apparatus in which the atmosphere on the substrate surface is blocked from the surrounding atmosphere, or in the apparatus in which the substrate is held by supplying inert gas to the space formed between the opposed member and the substrate as described in JP-A-2006-41444, the migration of the droplets tends to become significant due to a shorter distance between the opposed member and the substrate top surface. Therefore, in this embodiment, the droplets of the processing liquid adhering to the nozzle insertion hole are guided in the liquid discharging direction so as to be discharged from the nozzle insertion hole effectively.

In this embodiment, the following arrangement is adopted for the guide portion which guides the droplets in the liquid discharging direction. Specifically, the guide portion includes an enlarged part and a slanted part, the enlarged part being a part of the opening which is formed enlarging the opening in the liquid discharging direction relative to the nozzle inserted in the nozzle insertion hole, the slanted part being a part of an internal surface of the nozzle insertion hole which is formed slanting from a center of the nozzle insertion hole in the liquid discharging direction relative to the nozzle toward the enlarged part and separating away from the center of the substrate top surface.

Further, in this embodiment, the opposed member is arranged that the substrate opposing surface is approximately equal to or larger than the substrate top surface in a plan view and covers the entire substrate top surface. And, the enlarged part is extended in a radial direction of the substrate beyond the top rim portion of the substrate. Hence, the droplets are guided by the enlarged part to a location away from the substrate. As a result, the droplets are moved away from the substrate top surface, and it is possible to perform the surface processing of the substrate more favorably.

Further, in this embodiment, the rotating unit which rotates the substrate held by the substrate holder is further provided. Hence, the processing liquid is continuously supplied from the nozzle to the top rim portion of the rotating substrate. Therefore, the entire top rim portion of the substrate is processed uniformly.

Second Embodiment

Figure 9:
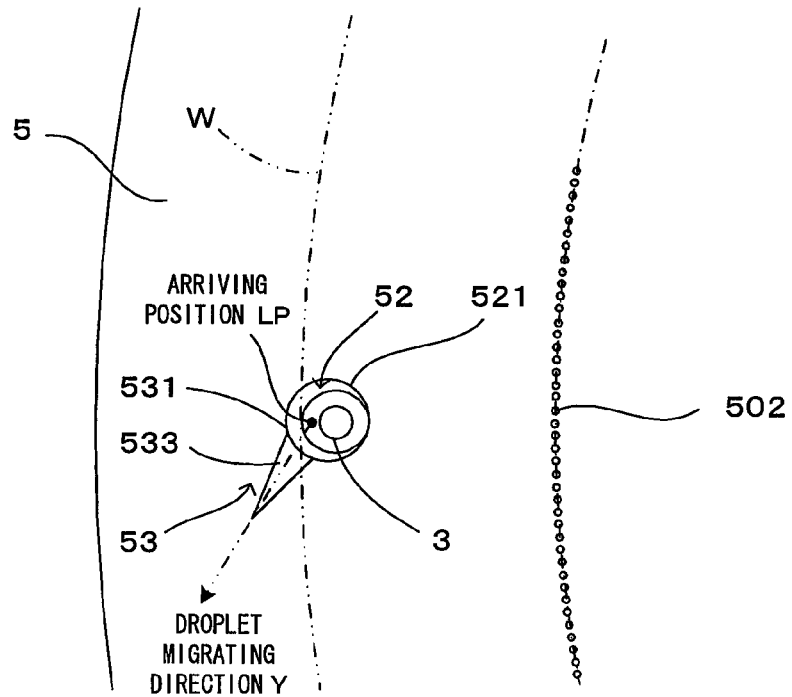
FIGS. 9 and 10 are diagrams showing a second embodiment of a substrate processing apparatus according to this invention.
Figure 10:
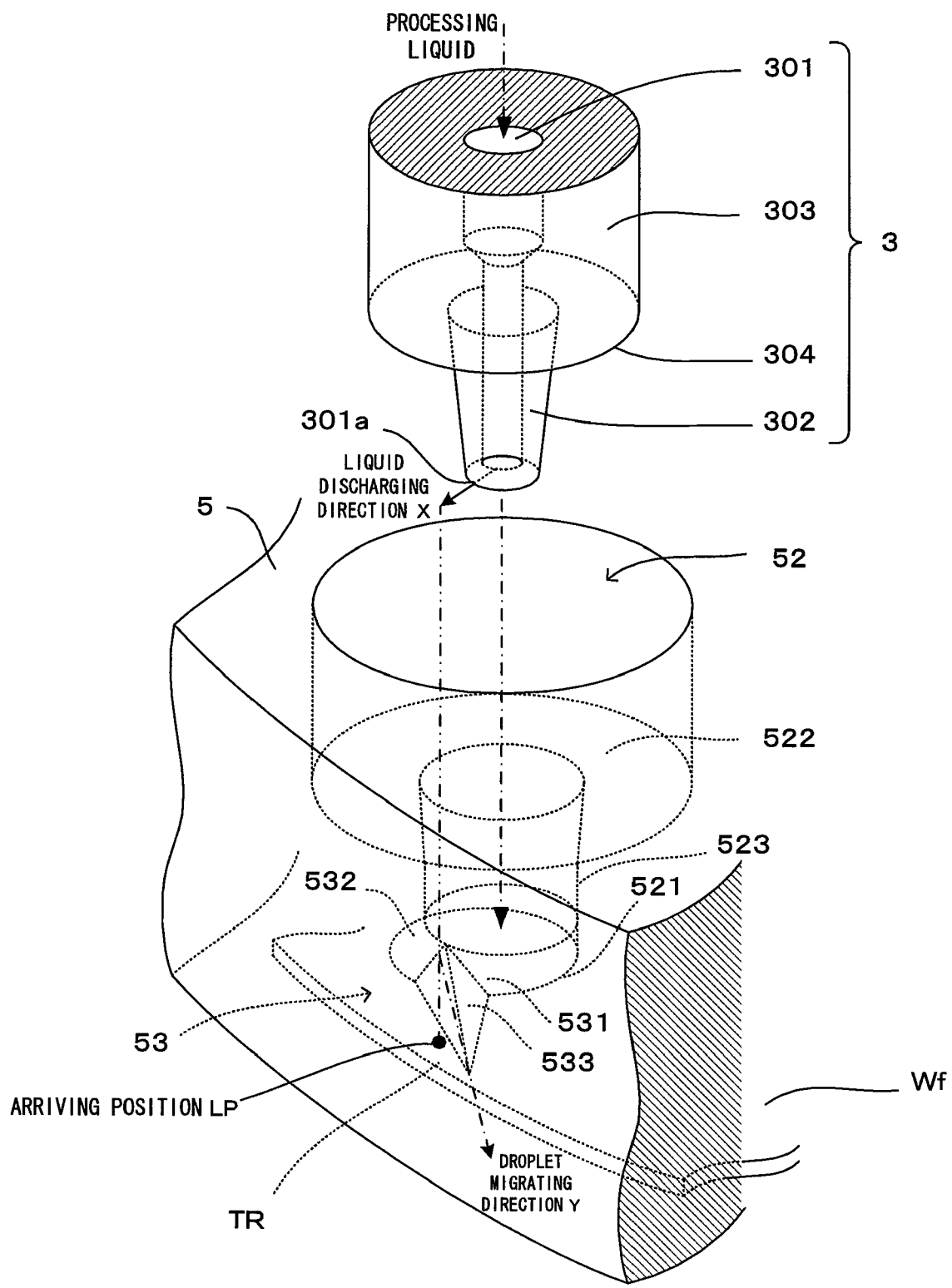

FIGS. 9 and 10 are diagrams showing a second embodiment of a substrate processing apparatus according to this invention. FIG. 9 is a lower surface view of the opposed member from the substrate, and FIG. 10 is a partial perspective view showing a nozzle and a nozzle insertion hole. A major difference of the substrate processing apparatus according to the second embodiment from the first embodiment is that a groove part 533 is additionally formed as the guide portion 53 near the opening of the nozzle insertion hole 52. The other structure is the same as that according to the first embodiment. Therefore, the description herein is focused on the differences, and the same structure will be denoted at the same reference symbols but will not be described.

In this second embodiment, the groove part 533 is provided near a part (corresponding to the enlarged part 531 in the partial enlarged view in FIG. 5A) of the opening 521 located in the liquid discharging direction X relative to the nozzle 3 inserted in the nozzle insertion hole 52. This groove part 533 is shaped like an upper beak extending in the droplet migrating direction Y as shown in FIG. 10, and has a function of guiding the droplets which have migrated from the substrate W to the droplet migrating direction Y. This "droplet migrating direction" means migrating direction Y of the droplets which move from the substrate W toward the nozzle insertion hole 52, and is determined by a force applied to the droplet DL as shown in FIG. 8. Specifically, it is determined by a rotation speed of the substrate W and a discharging force of the processing liquid from the nozzle 3.

As described above, in this embodiment, the droplets DL that have migrated and adhered to the nozzle insertion hole 52 will be guided to the location away from the substrate W not only by the enlarged part 531 and the slanted part 532 but also by the groove part 533. Moreover, the groove part 533 and the top rim portion TR are in the positional relationship similar to those in the first embodiment. Specifically, also in this embodiment, the substrate opposing surface 501 has a plan size larger than the substrate top surface Wf, covers the entire substrate top surface Wf, and the groove part 533 is provided extending beyond the top rim portion TR of the substrate W in the radial direction of the substrate W (see FIG. 9). As a result, the droplets DL can be moved away from the substrate top surface Wf, and the substrate processing can be executed more favorably.

In other words, in this embodiment, the following arrangement is adopted for the guide portion which guides the droplets in the liquid discharging direction. Specifically, the guide portion includes a groove part which is provided in a part of the opening, is formed extending in a migrating direction of the droplets relative to the nozzle insertion hole in the vicinity of a part of the opening located in the liquid discharging direction relative to the nozzle which is inserted in the nozzle insertion hole.

Further, in this embodiment, the opposed member is arranged that the substrate opposing surface is approximately equal to or larger than the substrate top surface in a plan view and covers the entire substrate top surface. And, the groove part is extended in a radial direction of the substrate beyond the top rim portion of the substrate. Hence, the droplets are guided by the groove part to a location away from the substrate. As a result, the droplets are moved away from the substrate top surface, and it is possible to perform the surface processing of the substrate more favorably.

Others

Figure 11A:
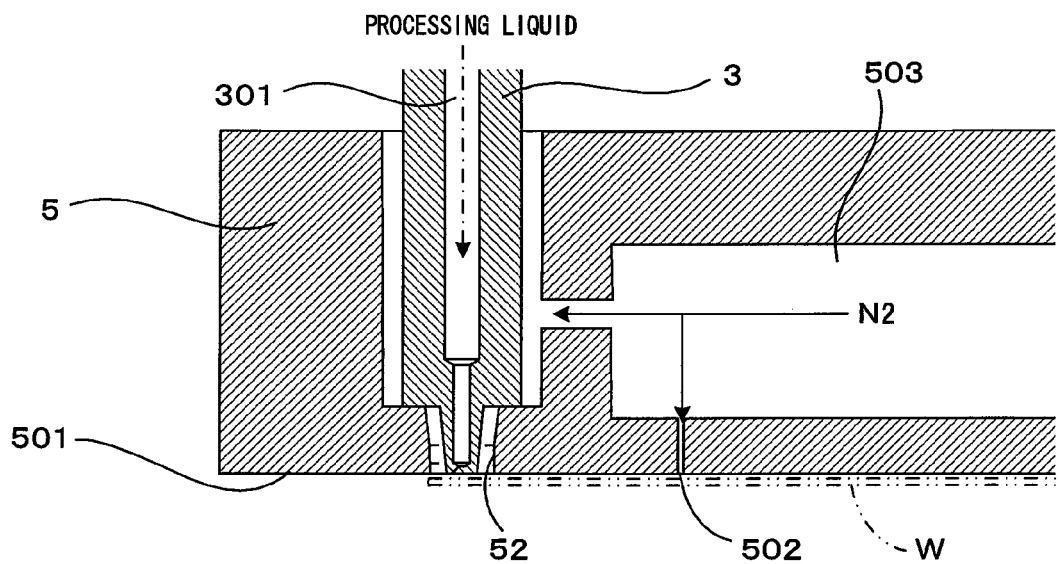
FIGS. 11A, 11B and 12 are diagrams showing a third embodiment of a substrate processing apparatus according to this invention.
Figure 11B:
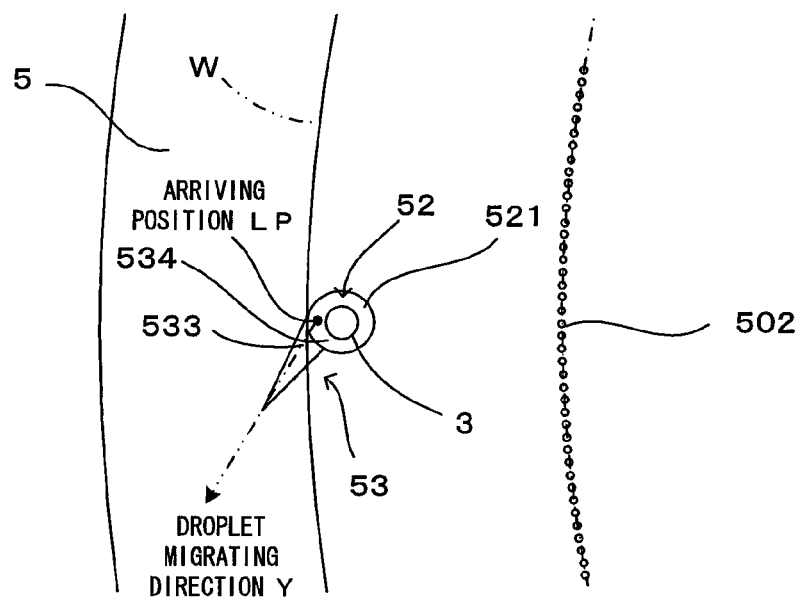
Figure 12:
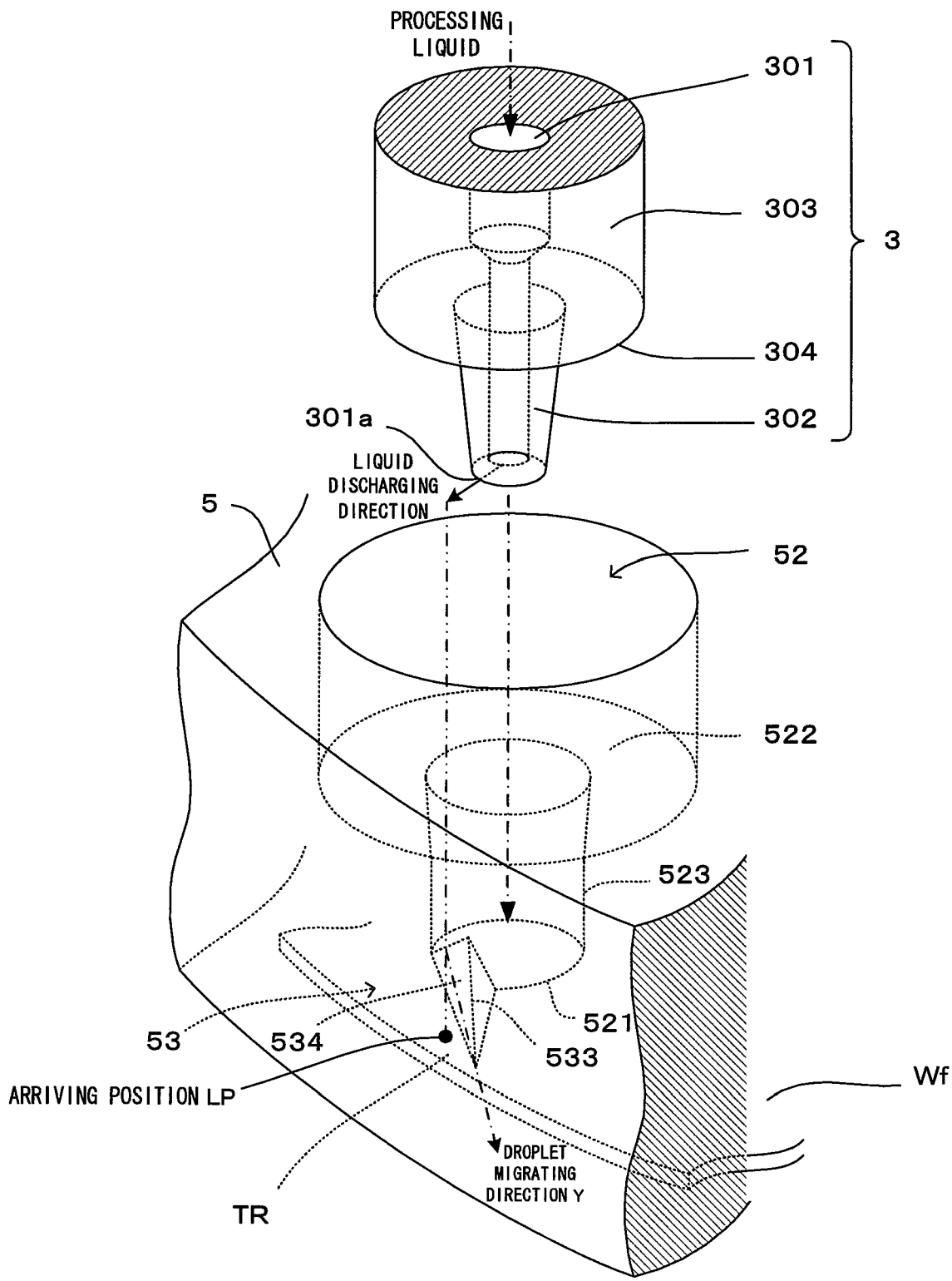

The invention is not limited to the embodiments described above but may be modified in various manners in addition to the embodiments above, to the extent not deviating from the object of the invention. For instance, in the second embodiment, the enlarged part 531, the slanted part 532 and the groove part 533 are provided as the guide portion 53. However, only the groove part 533 may be provided. That is, although a hole 523, which is below the abutting surface 522 of the nozzle insertion hole 52, is shaped like a boot in the first and the second embodiments, it may be shaped simply in a cylinder as shown in FIGS. 11A, 11B and 12. And, the groove part 533 may be provided near a part of the opening 521 located in the liquid discharging direction X relative to the nozzle 3 inserted in the nozzle insertion hole 52 and may be extended in the droplet migrating direction Y.

FIGS. 11A, 11B and 12 are diagrams showing a third embodiment of a substrate processing apparatus according to this invention. FIGS. 11A and 11B are diagrams showing the opposed member. FIG. 11A is a partial sectional view of the opposed member and FIG. 11B is a lower surface view of the opposed member from the substrate. FIG. 12 is a partial perspective view showing a nozzle and a nozzle insertion hole.

In a third embodiment arranged in a manner described above, the droplets that have migrated in the droplet migrating direction Y enter in the groove part 533 via a part 534 of the opening in the liquid discharging direction, are caught in an inner surface of the groove part 533, and are guided in a direction in which the groove part 533 extends, as shown in FIGS. 11B and 12. Hence, the droplets are discharged from the opening 521 of the nozzle insertion hole 52. As a result, the top rim portion TR of the substrate W can be processed excellently without negatively affected by the droplets. Meanwhile, it is desirable to form the inner surface of the groove part 533 broad in a region close to the nozzle 3. Having a shape like this makes it possible to catch the droplets that have migrated more securely.

Figure 14:
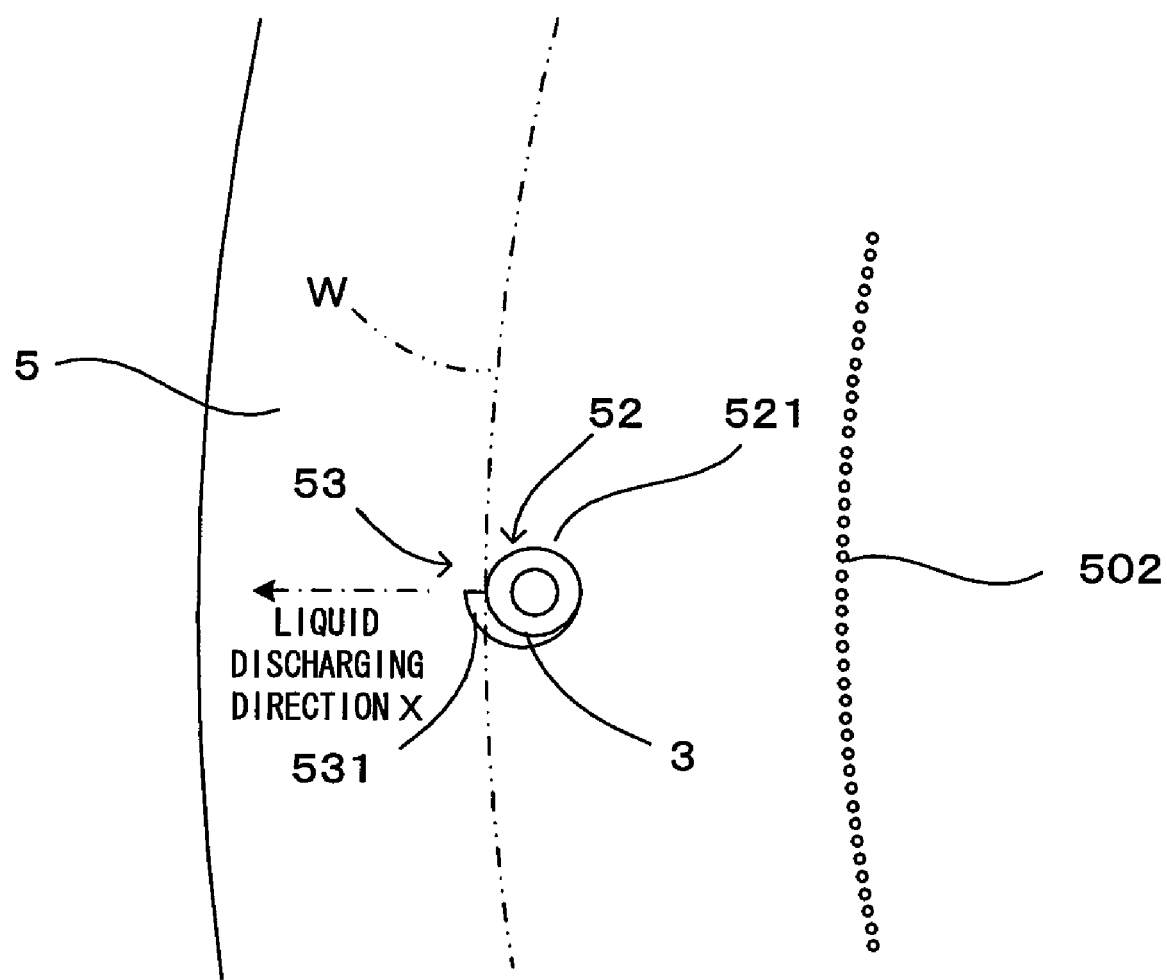
FIG. 14 is a lower surface view of the opposed member from the substrate in the embodiment of FIG. 13.

Further, in the first embodiment, the entire part of the opening 521 located in the liquid discharging direction X relative to the nozzle 3 inserted in the nozzle insertion hole 52 is provided as the enlarged part 531. However, the enlarged part 531 may be provided partially in the liquid discharging direction X as shown in FIGS. 13 and 14. In this case, the slanted part 532 becomes narrower than that of the first embodiment as the enlarged part 531 is formed partially. Nevertheless, the droplets DL adhering to the nozzle insertion hole 52 will flow in the liquid discharging direction X along the slanted part 532 to be discharged from the opening 521 of the nozzle insertion hole 52 in the same manner as the first embodiment. Meanwhile, in the case where the enlarged part 531 is provided partially as described above, it is desirable to take into account that the droplets DL from the substrate W migrate in the droplet migrating direction Y and adhere to the nozzle insertion hole 52. That is, it is preferable that the enlarged part 531 is provided in the liquid discharging direction X and in the droplets migrating direction Y as shown in FIGS. 13 and 14.

Further, in the above embodiments, the invention is applied to a substrate processing apparatus in which the internal pressure of the space SP is increased to press the substrate W against the group of supporting pins while the bottom surface (rear surface Wb) of the substrate W is supported by the group of supporting pins, and accordingly the substrate W is held. However, the application of the invention is not limited to this, and the method of holding the substrate is arbitrary. Specifically, the invention can be applied to an apparatus in general in which the opposed member is disposed opposed against the substrate top surface, the nozzle is inserted into the nozzle insertion hole provided in the opposed member, and accordingly the top rim portion of the substrate is processed.

The present invention is applicable to a substrate processing apparatus and a substrate processing method which performs a predetermined processing to a top rim portion of substrates in general including semiconductor wafers, glass substrates for photomask, glass substrates for liquid crystal display, glass substrates for plasma display, substrates for FED (field emission display), substrates for optical disks, substrates for magnetic disks, substrates for magnet-optical disks, etc.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus, comprising:
   a substrate holder which holds a substrate in a condition that a top surface of the substrate is directed toward above;
   an opposed member which is disposed opposed against and separated away from the top surface of the substrate held by the substrate holder, and is provided with a nozzle insertion hole which has an opening on a substrate opposing surface facing the substrate top surface;
   a nozzle which discharges, being inserted in the nozzle insertion hole, a processing liquid in a liquid discharging direction from the nozzle insertion hole toward a to rim portion of the substrate, supplies the processing liquid to the top rim portion, and accordingly performs a predetermined surface processing to the top rim portion; and
   a guide portion which is provided in the nozzle insertion hole and guides droplets of the processing liquid adhering to the nozzle insertion hole in the vicinity of the opening in the liquid discharging direction;
   wherein the guide portion includes an enlarged part and a slanted part, the enlarged part being a part of the opening which is formed enlarging the opening in the liquid discharging direction relative to the nozzle inserted in the nozzle insertion hole, the slanted part being a part of an internal surface of the nozzle insertion hole which is formed slanting from a center of the nozzle insertion hole in the liquid discharging direction relative to the nozzle toward the enlarged part and separating away from the center of the substrate top surface.

2. The substrate processing apparatus of claim 1, wherein the substrate opposing surface is approximately equal to or larger than the substrate top surface in a plan view and covers the entire substrate top surface, and
the enlarged part is extended in a radial direction of the substrate beyond the top rim portion of the substrate.

3. The substrate processing apparatus of claim 1, further comprising a rotating unit which rotates the substrate held by the substrate holder.

4. A substrate processing apparatus, comprising:
   a substrate holder which holds a substrate in a condition that a top surface of the substrate is directed toward above;
   an opposed member which is disposed opposed against and separated away from the top surface of the substrate held by the substrate holder, and is provided with a nozzle insertion hole which has an opening on a substrate opposing surface facing the substrate top surface;
   a nozzle which discharges, being inserted in the nozzle insertion hole, a processing liquid in a liquid discharging direction from the nozzle insertion hole toward a top rim portion of the substrate, supplies the processing liquid to the top rim portion, and accordingly performs a predetermined surface processing to the top rim portion; and
   a guide portion which is provided in the nozzle insertion hole and guides droplets of the processing liquid adhering to the nozzle insertion hole in the vicinity of the opening in the liquid discharging direction;
   wherein
   the processing liquid discharged in the liquid discharging direction can migrate in a form of droplets from the top rim portion of the substrate toward the nozzle insertion hole, and
   the guide portion includes a groove part which is provided in a part of the opening, is formed extending in a migrating direction of the droplets relative to the nozzle insertion hole in the vicinity of a part of the opening located in the liquid discharging direction relative to the nozzle which is inserted in the nozzle insertion hole.

5. The substrate processing apparatus of claim 4, wherein
the substrate opposing surface is approximately equal to or larger than the substrate top surface in a plan view and covers the entire substrate top surface, and
the groove part is extended in a radial direction of the substrate beyond the top rim portion of the substrate.

6. The substrate processing apparatus of claim 4, further comprising a rotating unit which rotates the substrate held by the substrate holder.

* * * * *